United States Patent
Weber et al.

(10) Patent No.: US 9,316,480 B2
(45) Date of Patent: Apr. 19, 2016

(54) METHOD OF FILLING LEVEL MEASUREMENT OF LAYERED MEDIA

(71) Applicant: SICK AG, Waldkirch (DE)

(72) Inventors: Thomas Weber, Waldkirch (DE); Stefan Schweiger, Waldkirch (DE)

(73) Assignee: SICK AG, Waldkirch (DE)

( * ) Notice: Subject to any disclaimer, the term of this patent is extended or adjusted under 35 U.S.C. 154(b) by 241 days.

(21) Appl. No.: 14/151,407

(22) Filed: Jan. 9, 2014

(65) Prior Publication Data

US 2014/0210488 A1    Jul. 31, 2014

(30) Foreign Application Priority Data

Jan. 25, 2013 (EP) ..................... 13152618

(51) Int. Cl.
*G01B 7/26* (2006.01)
*G01F 23/284* (2006.01)
*G01R 27/28* (2006.01)

(52) U.S. Cl.
CPC ................ *G01B 7/26* (2013.01); *G01F 23/284* (2013.01); *G01R 27/28* (2013.01)

(58) Field of Classification Search
None
See application file for complete search history.

(56) References Cited

U.S. PATENT DOCUMENTS

| | | |
|---|---|---|
| 5,723,979 A | 3/1998 | Mohr |
| 6,445,192 B1 | 9/2002 | Lovegren et al. |
| 6,724,197 B2 | 4/2004 | Neven et al. |
| 2006/0121915 A1* | 6/2006 | Patrick .................... G01S 19/29 455/456.2 |
| 2010/0026984 A1* | 2/2010 | Lewis ................... G01S 7/4811 356/5.01 |

FOREIGN PATENT DOCUMENTS

| | | |
|---|---|---|
| DE | 100 51 151 A1 | 4/2001 |
| DE | 100 44 888 A1 | 4/2002 |
| DE | 101 96 640 TI | 8/2003 |
| DE | 102 49 544 A1 | 5/2004 |
| DE | 10 2005 063 079 A1 | 7/2007 |
| DE | 10 2012 101 725 A1 | 9/2013 |
| EP | 0 871 019 A1 | 10/1998 |
| EP | 2 365 302 A1 | 9/2011 |
| JP | 2009-511933 A | 3/2009 |
| WO | 98/19139 A1 | 5/1998 |

* cited by examiner

*Primary Examiner* — Jermele M Hollington
*Assistant Examiner* — Douglas X Rodriguez
(74) *Attorney, Agent, or Firm* — Nath, Goldberg & Meyer; Jerald L. Meyer; Leonid D. Thenor

(57) ABSTRACT

A method of filling level measurement in a container (12) having a first medium (14) and at least one second medium (16) arranged thereabove, in particular a foam layer, wherein an electromagnetic signal is transmitted, in particular along a probe (28) arranged in the container (12), and a signal curve (S) of the signal reflected in the container (12) is recorded, wherein a signal time of flight (t) up to a border transition (18, 20) to the first medium (14) and/or up to the second medium (16) is determined with reference to the signal curve (S) and a filling level of the first medium (14) and/or a filling level of the second medium (16) is determined from the signal time of flight (t). In this respect, the border transition (18, 20) is recognized from the integral over the signal curve (S), the integral starting from a reference position ($t_0$).

18 Claims, 6 Drawing Sheets

METHOD OF FILLING LEVEL MEASUREMENT OF LAYERED MEDIA

Figure 1:
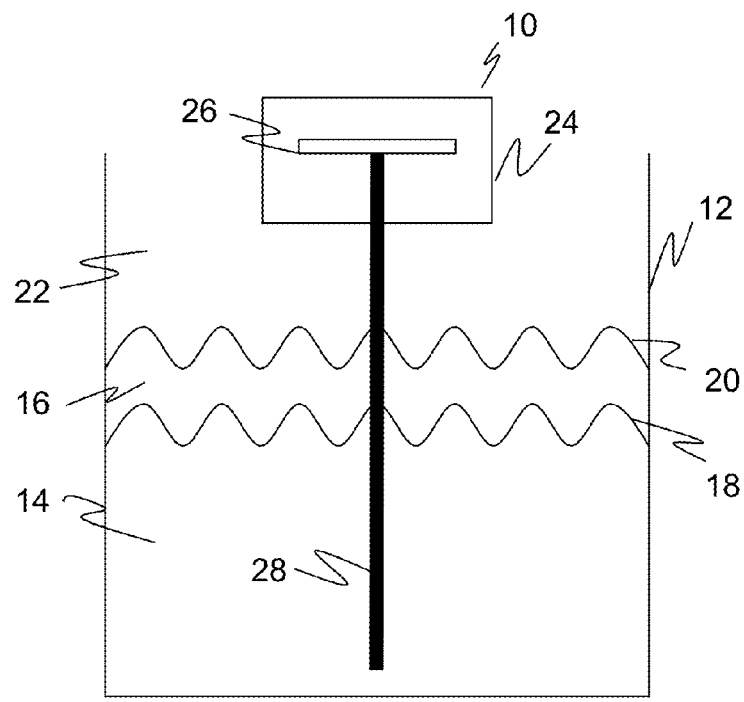

The invention relates to a method of filling level measurement in a container having a first medium and at least one second medium, in particular a foam layer, arranged thereabove in accordance with the preamble of claim 1 and to a sensor configured for this method.

A known method for filling level measurement is based on transmitting an electromagnetic signal into the container having the filling level to be measured and on evaluating the reflected signal. One possibility is to radiate the signal freely as is done with radar.

Due to the uncontrolled wave propagation, the method of time domain reflectometry (TDR) is frequently preferred. It is based on the determination of times of flight of an electromagnetic signal to determine the interval of a discontinuity of the characteristic impedance of a line. The difference from radar is that the electromagnetic waves are not irradiated into the open, but are rather conducted along a conductor. The conductor is configured as a monoprobe or as a coaxial probe which is introduced into the tank perpendicularly or obliquely and reaches as closely as possible to the bottom to cover the full measurement region.

In a TDR measurement, a very short electrical transmitted pulse is fed into the conductor and runs through it in the direction of the oppositely disposed end. If the pulse is incident on an interference site, which is equal to a change in the local characteristics impedance, a portion of the transmitted energy is reflected back to the conductor inlet. The position of the interference site can be calculated in a locally precise manner from the time of flight between the transmission of the transmitted pulse and the reception of the reflection. An important example of an interference site is a boundary surface which separates two spatial zones having different physical or chemical properties such as a boundary surface between two media.

To be able to determine the time of reception precisely, the curve of the reception signal is scanned and supplied to a digital evaluation. In this respect, for example, local extreme sites are searched for in the signal curve and their time position is associated with a reflection at a boundary surface.

Difficulties arise when a plurality of boundary surfaces are present such as is the case, for example, with a plurality of media in a container. In this respect, it can be water which collects at the bottom of an oil tank. An important case is foam formation at the surface of a liquid. It is frequently desirable here to determine the filling level of the actual medium. A reflection at the boundary surface to the foam can, however, be confused with the measured pulse of the medium or can even merge with this measured pulse in a manner such that a sensible measured result is no longer delivered at all. A conventional evaluation algorithm which is only designed for the recognition of individual reflection signals can therefore not deal with such measurement situations.

Even an extension of a conventional evaluation algorithm by a multiecho resolution of a plurality of boundary layers is thus precluded by the requirement often not present in practice that the dividing layers have to have a specific spacing so that the pulses in the echo signal which result from the dividing layers have a sufficient spacing from one another. It becomes even more difficult when the individual layers of the media are not even homogeneous per se. The density and thus the relative dielectric constant can, for example, increase in accordance with an unknown, usually monotonous function with foam so that numerous mutually superposed pulses result in the echo signal.

A possible solution could be to increase the bandwidth of the transmitted pulse. Echo pulses are thereby rather separated which arise by boundary layers disposed close to one another. At the same time, however, the demands on the electronic design increase, for instance the sampling rate and the subsequent signal detection. In addition, at very high frequencies above 10 GHz, the damping in a monoprobe increases greatly due to the skin effect so that the signal-to-noise ratio can be insufficient. In any case, an increase in bandwidth does not yet solve the problem of distinguishing the echoes arising at the foam and medium and so of ensuring that it is not the foam level which is output as the filling level of the medium, that a falsified filling level is not output or that in the worst case no measured value at all is output.

Another solution could comprise using a coaxial probe instead of a monoprobe. The resistance to foam can thereby be improved since the echoes are mainly caused by variations in the field space within the coaxial tube. It is possible to minimize the penetration of foam into the tube by an advantageous configuration of the coaxial tube with only small openings. However, the use options are thus also restricted with respect to a monoprobe since portions of the medium to be measured can be deposited in the coaxial tube. This can impair the availability of the sensor. The use is often not possible at all in applications with hygiene demands. In addition, the filling level of the foam itself cannot be determined in this manner.

The approach of reducing the foam formation from the start by the addition of chemical agents or by the operation of the plant with optimized process parameters cannot be implemented in most applications. Chemical agents influence the process medium and are anyway usually inconceivable in the food sector. The problem can be alleviated by optimized process parameters; particularly in the operating phase on start-up, a foam formation can, however, rarely be sufficiently suppressed in this manner.

EP 2 365 302 A1 describes a process in which the spacing from a boundary surface and the relative dielectric constant of the medium producing the boundary surface is determined a first time with reference to a transition pulse at the transition of the probe into the container and to the echo at the boundary surface and a second time with reference to an artifact pulse from the end of the probe. If these measurements are not consistent with one another, the presence of a further boundary layer is concluded and the process is applied iteratively to the further boundary layer until all filling levels are measured. This requires precise information on the two reference pulses, that is on the transition pulse from the start of the probe and on the artifact pulse from the end of the probe. To achieve a sufficient precision here, high demands are made on the electronics which result in corresponding manufacturing costs. Not even with this can a conclusion be drawn sufficiently precisely on the transmitted portion of the transmission energy from the transition pulse of a monoprobe which, unlike a coaxial probe, is exposed to a very high number of interference effects. In addition, the artifact pulse at the end of the probe is delayed and attenuated in an initially completely undefined manner by the propagation in the different media and is therefore not available as a reliable reference in many measurement situations. In addition, at low filling levels, the artifact pulse can also have measured pulses superimposed so that the reference is even falsified.

DE 100 51 151 A1 shows a TDR process for determining the positions of upper and lower boundary surfaces of a first liquid which floats on a second liquid of a container. It is, however, not more precisely explained how the corresponding echoes at the two boundary surfaces can be recognized and distinguished. In addition, the evaluation here is also based on the artifact pulse which is called the reference return pulse in DE 100 51 151 A1. It has the substantial disadvantages described above.

A filling level sensor is known from U.S. Pat. No. 6,724,197 B2 with which the filing level of the lower of two media layered over one another can be determined. A special and complex and/or expensive probe form is, however, required for this purpose.

U.S. Pat. No. 5,723,979 A discloses a TDR filling level sensor for measurement in liquid mixtures. Only a probe shape is described. An evaluation process, let alone a determination of the distance from a plurality of border layers, is not described.

Twin pulses on double boundary surfaces are split by a TDR sensor using the gradient behavior of the signal shape in U.S. Pat. No. 6,445,192 B1. It is, however, not explained how the filling level of a medium disposed below an interference layer is measured by this.

An improved threshold value setting for a radar level transmitter is known from DE 101 96 64#0 T1 which is used while using a TDR process for measuring filling levels of a plurality of materials in storage tanks. In this respect, a plurality of respective threshold values are used which are in relationship with a specific material boundary surface to detect the levels of the different materials.

The dielectric constants and layer thicknesses of superposed filling materials are determined from the amplitude ratio of an echo curve of a pulse radar in DE 100 44 888 A1.

The post-published DE 10 2012 101 725 identifies a first measured pulse and a second measured pulse in a signal curve of a TDR filling level sensor with reference to expected amplitude values, said first and second measured pulses arising at a boundary surface to the medium to be measured or to an interference layer or foam layer located thereabove. The expected values are in particular calculated from a known relative dielectric constant of the medium and from a reference amplitude of an artifact pulse arising at the probe end with an empty container.

To the extent that the possibility is present at all accordingly in the prior art to resolve a plurality of boundary layers, all these processes are based on recognizing pulses at the boundary layers. However, the recognition of individual pulses fails at thin layers and above all at foam which can form in a great variety of manners and can generate a plurality of pulses running into one another. As a result there are large measurement errors or, when a plurality of pulses have merged with one another beyond all recognition in the recorded signal and therefore a measured pulse can no longer be recognized, there are even defective states of the sensor. TDR sensors can therefore not be used for the foam measurement.

It is therefore the object of the invention to improve the filling level measurement in a container having a plurality of layers.

This object is satisfied by a method of filling level measurement in a container having a first medium and at least one second medium arranged thereabove in accordance with claim 1 as well as by a sensor configured for this method in accordance with claim 15. In this respect, the invention starts from the basic idea of not only evaluating the signal curve of a signal reflected in the container at the point where a border transition is localized, but rather to integrate the integral over the signal curve starting from a reference position of the probe. In this respect, an integral over the signal curve arises which is itself a function of that of the probe position up to which integration respectively took place or it is a function of the time monotonously associated with the probe position. The history of the signal portions reflected by the border transition is thus so to speak also taken into account.

The signal curve is preferably a discretely scanned time series of amplitude values of the reception intensity of the transmitted signal, for example a microwave signal, reflected in the container. Integration is here understood as the formation of a summary measure for the signal curve up to an observation point. For this purpose, the discrete sampled values are summed in the simplest case. This corresponds to an approximation of the integral by a step function. More precise integration processes such as the trapezoidal process or the Runga-Kutta method are, however, equally conceivable.

The invention has the advantage that a measurement is also made possible up to the surface of a specific medium when further media or interference layers such as foam lie thereabove. Due to the integration this is possible fully independently of the specific curve shape and in particular of how well pulses can be identified in the signal curve. Individual amplitude values of the signal curve are compared just as little with thresholds or similar where there would always be great dependencies on marginal conditions which are difficult to control. The measurement thereby becomes extremely robust and also meaningfully evaluates signal curves in which no pulses at all can be recognized. Layers above the medium to be measured may in this respect even be inhomogeneous per se as in some cases of foam which practically forms a plurality of border transitions between foam layers of different density. In contrast to the prior art, the invention makes it possible to be able to use TDR sensors for foam measurement at all in practice.

The reference position is preferably a probe start. In this respect, it is not necessarily the physical probe start when a probe is, for example, screwed in the interior of the sensor head, but rather the start of the desired measurement region for filling levels. This reference position can, for example, be recognized in the signal curve as a pulse which almost inevitably arises in the transition from the sensor head to the probe. The reference position can, however, equally also be derived from construction properties of the sensor or can be calibrated ex works or at the operating site.

The signal time of flight is preferably summed from signal time of flight intervals which take account of a delay in the signal propagation at the probe position belonging to a respective signal time of flight interval by a correction with the integral over the signal curve integrated up to this respective probe position. The transmitted signal penetrating into the second medium is delayed by the electrical dielectricity constant which is higher there in comparison with air. This should be compensated in the conversion of the signal time of flight into an equivalent signal path for the determination of a spacing of the border transition and thus of the filling level. However, the dielectricity constant is unknown as a rule or it changes in the extreme case from sampling point to sampling point of the signal curve in the case of inhomogeneous foam. A time adaptation is therefore carried out in this preferred further development. The dielectricity constant which acts at the respective considered probe position in this respect is estimated with the aid of the integral over the signal curve integrated up to then in order in this manner to take account of the signal portions reflected up to this probe position.

An environmental constant dependent on the specific wave propagation in the container preferably additionally enters into the correction. The specific environment of the probe decisively defined by the container, above all by its geometry, likewise acts on the signal curve. This applies all the more with a monoprobe. To become independent of these influences on the estimation of the relative dielectricity constant and of the time adaptation, an environmental constant is determined or defined. The time adaptation therefore takes account of at least two influence values, namely the integral over the signal curve and the environmental constant.

The environmental constant is preferably determined in a calibration measurement with an empty container in which an integral of the signal curve is formed over a region of an artifact pulse arising at the probe end. The signal energy remaining after reflections at the various border transitions is reflected at the probe end. With an empty container, this is practically the total signal so that a pronounced pulse arises. The pulse can be identified easily manually or automatically and is moreover located at a fixed time position determined by the probe length since no signal delays occur due to relative dielectricity constants different from air with an empty container. Numerous factors dependent on the container and on the instrument and thus the associated setting steps and calculations can be dispensed with by referencing the artifact pulse. The problems in the measurement of the artifact pulse described in the discussion of the prior art do not arise here because measurement takes place in a controlled, very simple situation with an empty container. Although the artifact pulse represents a particularly simple and reliable measure for the environmental constant, in principle the influences specific to the instrument and to the container compensated thereby can be modeled or measured. It is also conceivable to use the transmitted pulse or a transition pulse at the transition between the sensor head and the probe instead of the artifact pulse.

The border transition is preferably recognized by a comparison of the integral over the signal curve with a threshold value. The integral over the signal curve is therefore successively integrated from a time onward corresponding to the reference position up to a time always considered later until the integral over the signal curve exceeds the threshold. The time considered last in this respect is considered as belonging to the position of the sought border transition and is converted into a filling level. In this manner, a very simple process is set forth to determine the border transition in a stable manner and completely independently of the shape of the signal curve, that is in particular independently of whether pulses can be identified in the signal curve.

The integral over the signal curve is preferably integrated a second time for the comparison; however, instead of the signal curve itself its absolute amount or the signal curve squared point-wise is used as the basis for the second integration. The signal curve can namely also adopt negative values. This takes place, for example, when denser foam is located above looser foam. Another example is an air bubble in a coaxial probe. It is correct to consider this sign for the determination of the signal time of flight, in particular the time adaptation. Negative portions in the signal curve, however, also correspond to reflected transmission energy. Since the threshold measures how much transmitted energy has already been lost by reflections above a respective observed probe position, the sign should be ignored in this respect. This takes place by forming the absolute amount or by squaring, with the latter producing the physically correct measure for the energy. Other derived parameters are also conceivable instead of an absolute amount or a point-wise squaring.

The border transition is preferably recognized in an iterative process which integrates the signal curve in steps predefined by the sampling rate of the signal curve from the reference position up to an abort criterion, namely whether the integral over the signal curve integrated up to the respective step or a corresponding integral of the absolute amount of the signal curve or of the point-wise squared signal curve exceeds the threshold value. Such an iterative process can be easily converted into an algorithm for a digital processing.

The signal time of flight to be determined is preferably initially set to zero and is increased by an increment in each step which is calculated as a quotient whose numerator is formed by the sum of the environmental constant and the integral over the signal curve and whose denominator is formed by the difference from the environmental constant and the integral over the signal curve. A time adaptation thus takes place in an iterative manner to compensate the fact that time intervals in the signal curve do not directly correspond to signal transit paths, but rather that here a signal delay occurs due to a relative dielectricity constant different from air within a medium. This dielectricity constant is estimated at every position using the given calculation for the increment. In this respect, as already described above, the signal portions which have already been lost due to reflections above the position and which are detected in the integral over the signal curve and the specific environmental influences on the wave propagation have an influence, on the one hand, which are taken into account by the environmental constant and in particular by an integral over the artifact pulse from the probe end.

The threshold value is preferably determined by a calibration measurement in which only the first medium is located in the container and a threshold integral of the signal curve is formed in the region of an echo signal at the border transition to the first medium. This is a simple process to determine a suitable threshold value under controlled conditions, namely without an interfering second medium. It is thereby ensured that a pronounced medium pulse is formed which is easy to recognize and to measure and over which the threshold integral is then integrated. As always, integral means a summary measure for the signal curve in the observed region to which the individual values of the signal curve contribute. Such a measure can be determined, for example, by numerical integration which can simply comprise the summing of the values of the signal curve.

The threshold value is preferably set to 90% to 110% of the threshold value integral to recognize the border transition to the first medium. The threshold value is thus made almost or fully equivalent to the threshold value integral. A certain relief from an identity is sensible, with a value below 100% ensuring that the threshold is also actually exceeded under noise influences and thus a measured value is generated which may somewhat underestimate the spacing of the border transition. Conversely, a value above 100% overestimates this spacing and thus prevents a filling level value within the upper second medium being incorrectly output.

The threshold value can preferably also be set to 5% to 30% of the threshold integral to recognize the border transition to the second medium. This threshold value should therefore be close to zero and should only be so large that just a mere noise is not recognized as a border transition. The uppermost border transition, that is the filling level of the second medium and in particular the foam surface, is thus measured. The more the threshold differs from zero, the more securely it differentiates from noise, but in so doing also increasingly overestimates the spacing of the uppermost border transition, that is it measures increasingly deeper into the second medium.

It is also conceivable to set the threshold both in the vicinity of 100% and somewhat above zero, i.e. effectively to use two thresholds. The uppermost border transition toward the second medium and the border transition to the first medium are thereby measured. Both filling levels and thus also the thickness of the layer of the second medium or of the foam layer are thus obtained.

The border transition to the second medium is preferably recognized in that the integral over the signal curve systematically differs from zero from the border transition onward. As soon as the integral over the signal curve differs from zero, there was a first signal reflection so that the signal entered into the uppermost medium at this point. It is, however, not sufficient in practice only to make a comparison with zero since this also occurs due to noise effects. If, however, the integral over the signal curve over a larger range is considered, it can be recognized whether the difference from zero is systematic or is only due to the noise. This procedure is an alternative to a threshold value process, with both processes also being able to be used and being able to be plausibilized with respect to one another or with the results being able to be offset against one another.

The signal curve of the integral over the signal curve and/or the threshold value are preferably scaled by a drift correction value. The temperature is an important cause for drifting in this respect. The drift correction value is determined, for example, in that a transition pulse at the probe start or the transmitted pulse itself is compared with a previously taught reference transition pulse. This transition pulse is largely independent of the filling level so that its changes can be traced back to drifting. It is then assumed that such drifts scale the transition pulse to the same extent as the other signal curve.

The signal curve is preferably rescaled with an amplitude characteristic dependent on the filling level. Multiple reflections namely result in the upper measurement range and signal portions of said multiple reflections returning to the probe start from a medium surface are again reflected into the container. This can easily repeat a multiple of times. In this manner, subsidiary pulses which further weaken with each multiple reflection are effectively transmitted directly after the actual transmitted pulse and superposed on it. Higher amplitudes in the upper measurement range result. This effect can be modeled or measured at different filling levels and in this manner an amplitude characteristic depending on the filling level can be determined which includes the exaggerated signal due to multiple reflections as a factor in dependence on a filling level. This amplitude characteristic will be above one in the upper measurement region and will then drop to one at filling levels at which these multiple reflections no longer play a role in order actually to fall below one at larger distances due to damping. This interference effect is compensated by rescaling the signal curve with the amplitude characteristic.

Figure 2:
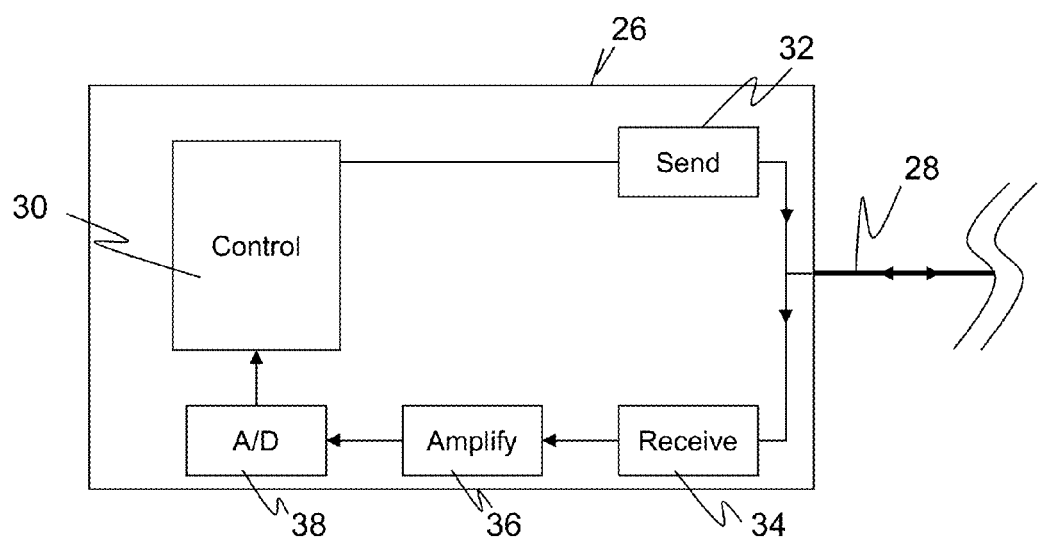
Figure 3:
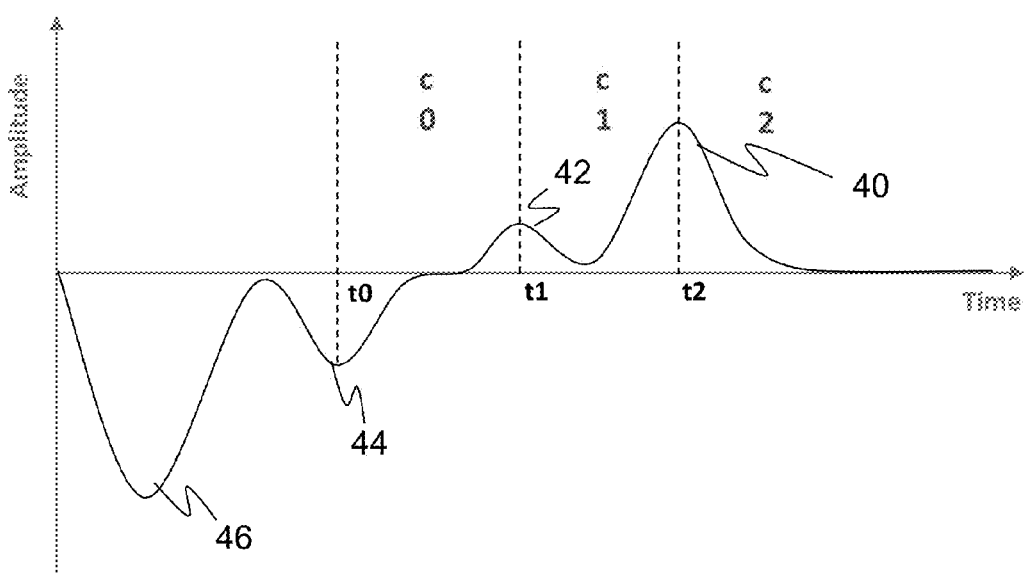
Figure 4:
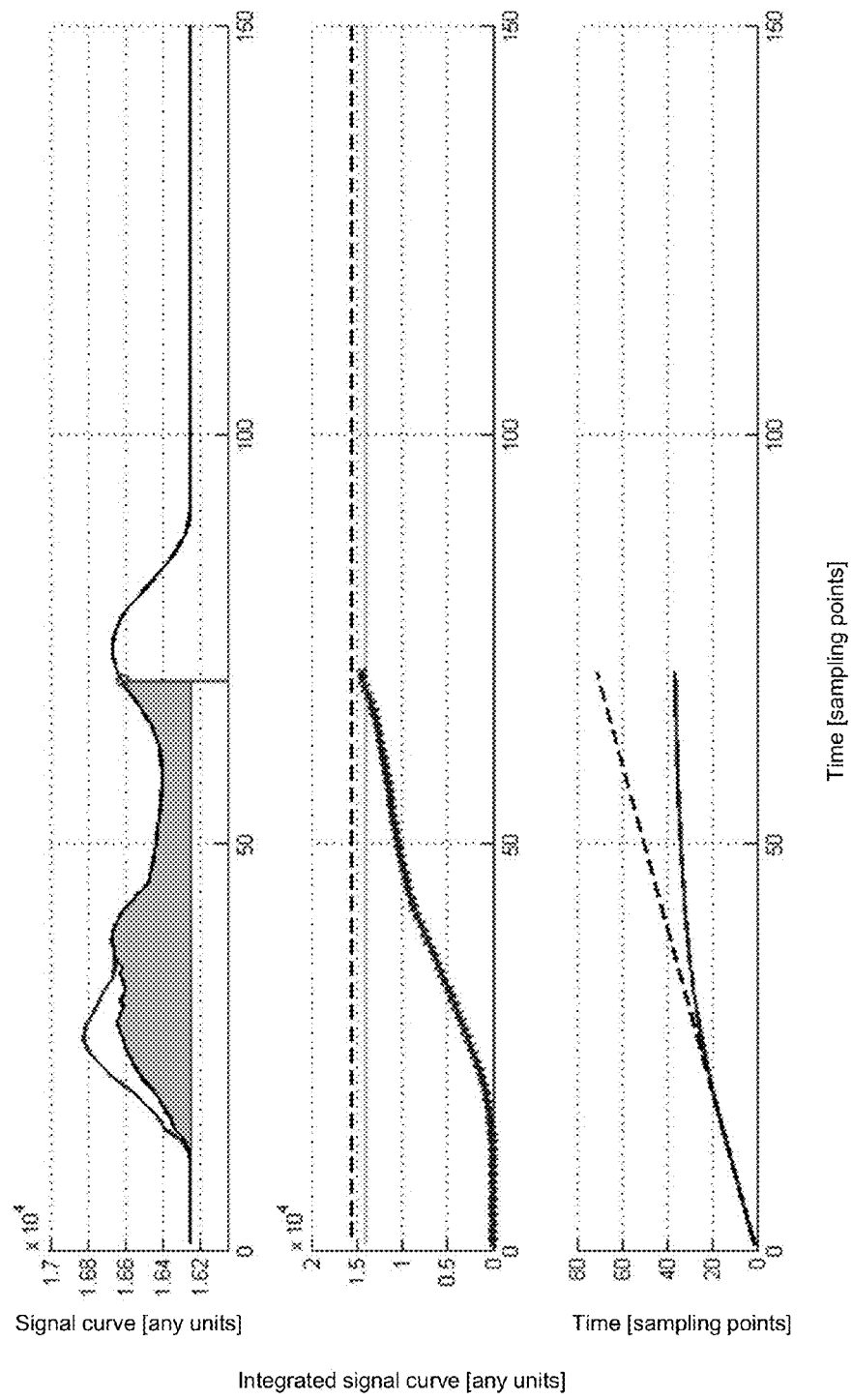
Figure 5:
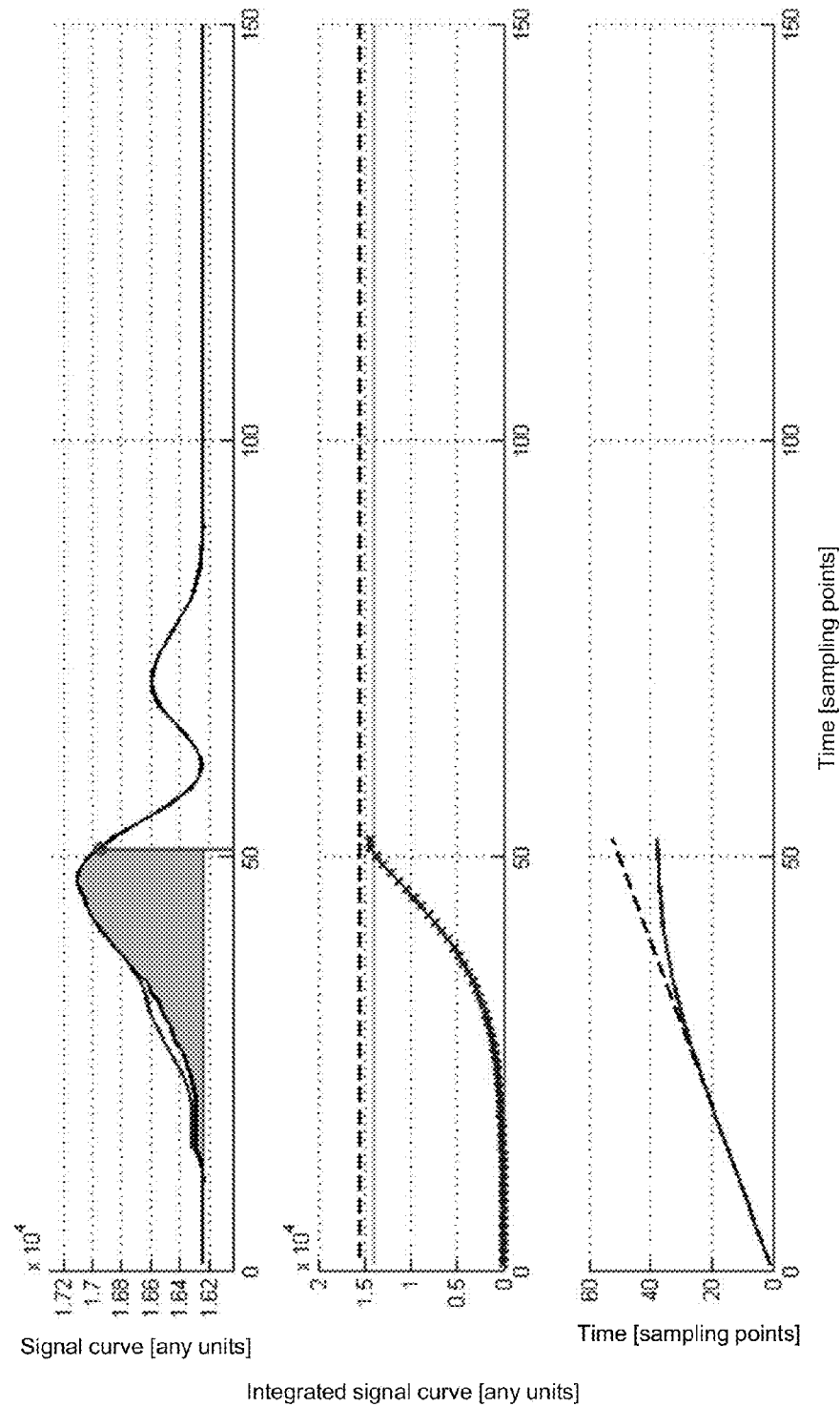
Figure 6:
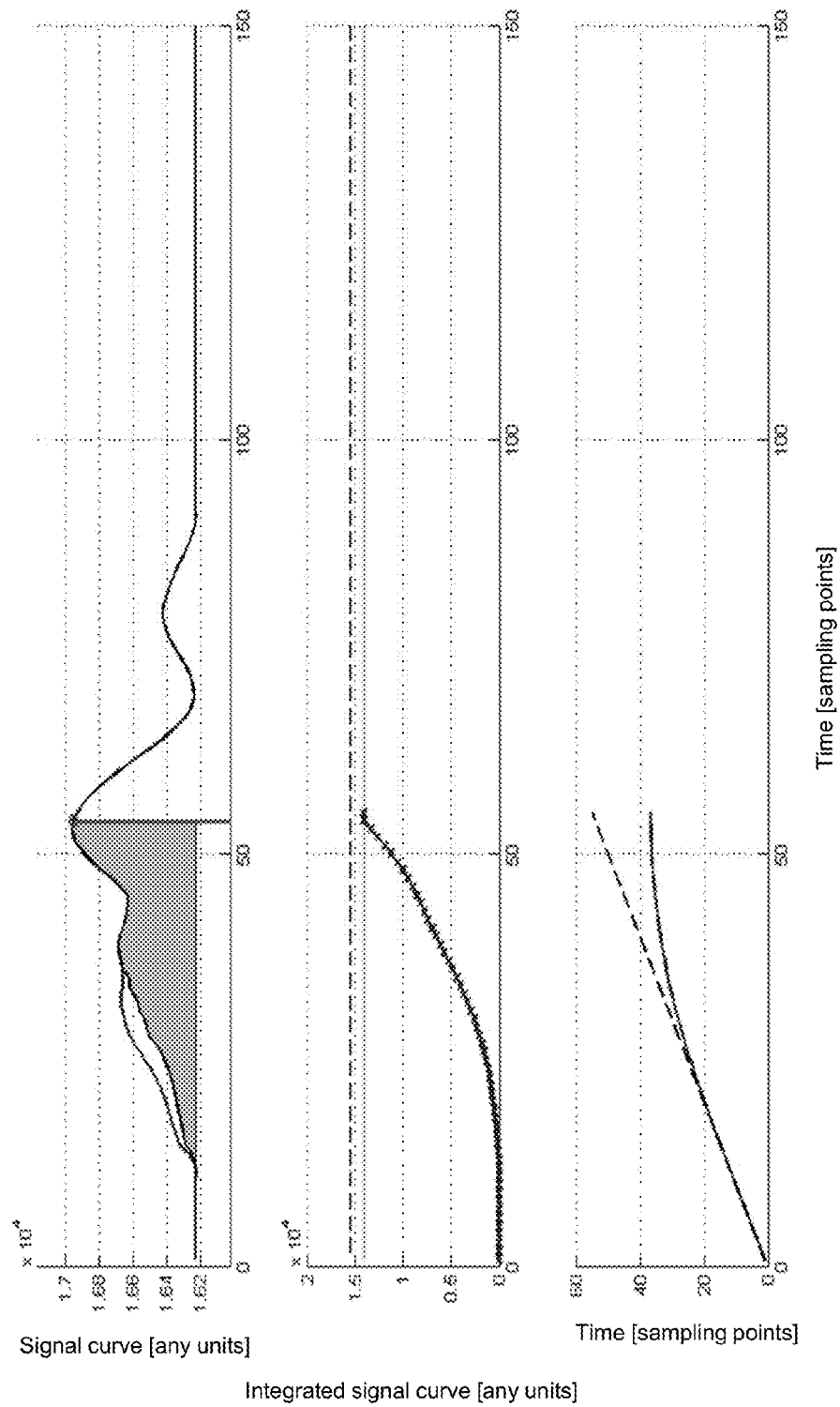
Figure 7:
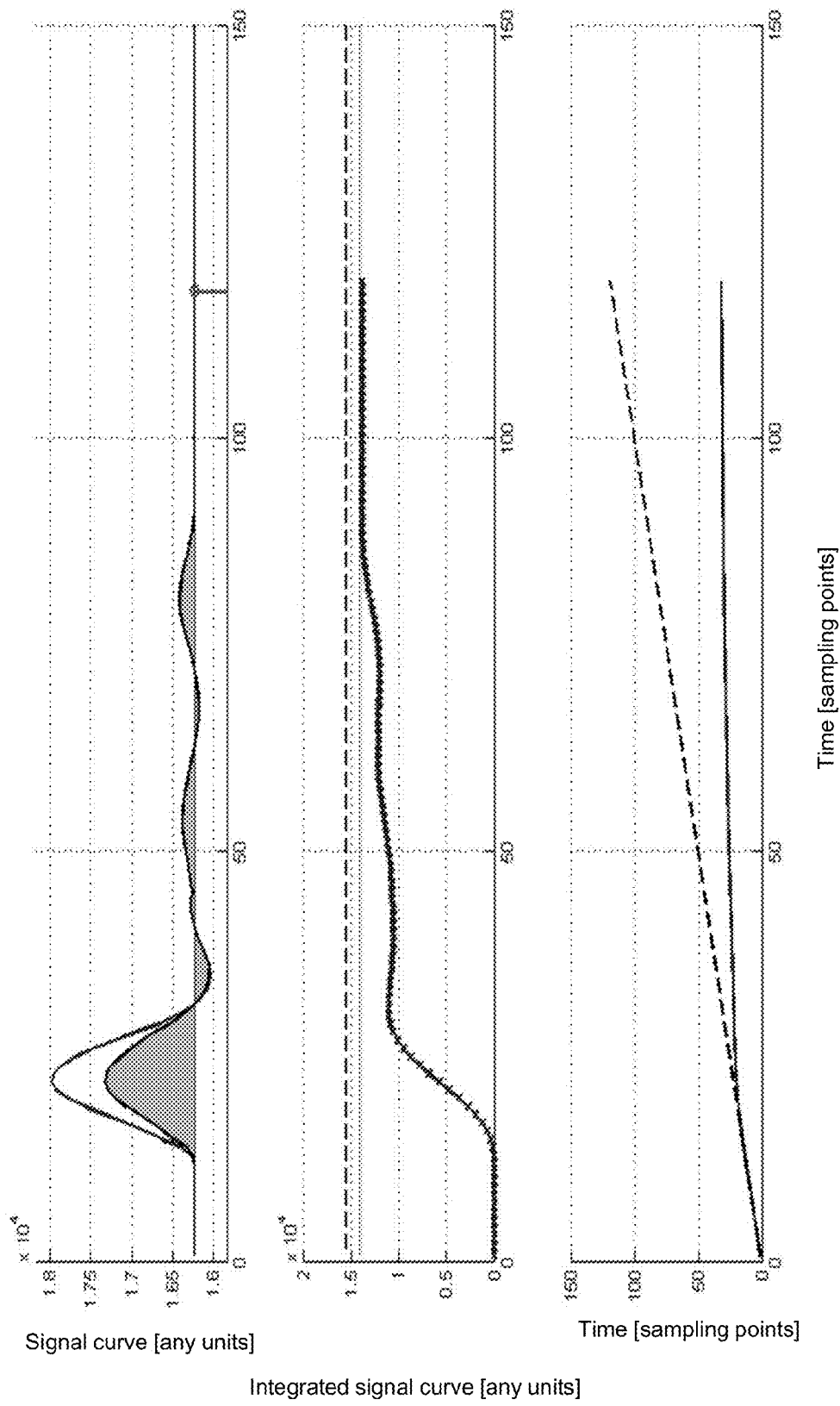

The invention will also be explained in the following with respect to further advantages and features with reference to the enclosed drawing and to embodiments. The Figures of the drawing show in:

FIG. 1 a schematic cross-sectional representation of a filling level sensor in a container;

FIG. 2 a schematic block diagram of a sensor head of the filling level sensor in accordance with FIG. 1;

FIG. 3 an exemplary schematic signal curve with well-separated measured pulses of border transitions at two media as a comparison;

FIG. 4 a signal curve with characterization of the time recognized as a border transition to a first medium in an example of a container with a liquid and with a thick foam layer arranged thereabove, in the upper part;

a representation of the integral over the signal curve and of the threshold crossing, in the middle part;

a representation of the corrected time of flight in comparison with a time of flight in air, in the lower part;

FIG. 5 representations in accordance with FIG. 4 in an example of a container with a liquid and with a thin foam layer arranged thereabove whose density continuously increases;

FIG. 6 representations in accordance with FIG. 4 in an example of a container with a liquid and with a thinner foam layer arranged thereabove and of a different consistency than in FIG. 5; and FIG. 7 representations in accordance with FIG. 4 in an example of a container in which only foam is present.

FIG. 1 schematically shows a TDR sensor 10 which is attached as a filling level sensor in a tank or container 12 having a liquid or generally having a medium 14. A second medium 16, for example foam in a different consistency, is located above the medium 14 or an oil layer as a second medium 16 on water as the actual medium 14. The relative permittivity or relative dielectricity constant $\in_{r2}$ in the second medium corresponds neither to air nor to the medium 14 and can vary within the second medium 16 at different vertical positions.

The medium 14 forms a first boundary surface 18 or a first border transition with respect to the second medium 16 and the second medium 16 forms a second boundary surface 20 with respect to the air located thereabove. The sensor 10 is configured to determine the distance from at least one of the boundary surfaces 20, 22 and to derive the filling level from its known attachment position from this and, if necessary, also to derive the quantity of the medium 14 or of the second medium 16 using the geometry of the container 12. The general procedure in this respect corresponds to that described in the introduction and to TDR processes known per se, but differs in the improved evaluation still to be explained. Although the configuration of the sensor 10 as a filling level sensor for liquids is a very important field of use, the sensor 10 can in principle also be used for other media. In this respect, in particular bulk goods or granulates can be thought of.

The sensor 10 has a sensor head 24 having a control 26 which is preferably accommodated on a common circuit board. Alternatively, a plurality of circuit boards or flexprint carriers connected via plugs are conceivable. A probe 28 is connected to the control 24 and is here configured as an open monoprobe and thus inter alia has the advantage that it can easily be cleaned for applications in the hygiene sector. The probe 28 can, however, also be a coaxial probe.

The control 26, for example, its circuit board, provided in the sensor head 24 is shown in a block diagram in FIG. 2. The actual control and evaluation unit 30 is implemented on a digital module, for example a microprocessor, ASIC, FPGA or a similar digital logic module as well as a combination of a plurality of such modules. As also already described in the introduction, in a measurement, a signal, preferably a pulse, is output via a microwave transmitter 32 to the probe 28 and the time of flight of the reflected pulse arising at a boundary surface 18 and received in a microwave receiver 34 is measured to determine the spacing of the boundary surface 34 and thus the filling level in the container 12. The received signal of the microwave receiver 34 is digitized for the evaluation after amplification in an amplifier 36 with a digital/analog converter 38.

FIG. 3 shows for illustration a schematic signal curve with well-separated measured pulses 40, 42 at the boundary surfaces 18, 20. Conventional evaluations could easily localize the measured pulses 40, 42 in such a signal curve. Difficulties arise when the measured pulses 40, 42 run into one another. The problem of identifying measured pulses 40, 42 when the second medium 16 is inhomogeneous per se and thus produces a plurality of superposed pulses of an unknown number is previously not solvable.

The signal curve contains still further pulses, namely a transition pulse 44 at the probe start in the transition between the sensor head 24 and the probe 28 as well as the transmitted pulse 46 itself. Further to the right, and no longer shown, an artifact pulse arises at the probe end where the residual energy of the transmitted signal remaining after the reflections at the boundary surfaces 18, 20 is reflected.

In order also to be able to determine filling levels of the media 14, 16 in accordance with the invention in general cases with no longer identifiable measured pulses 40, 42, the approach described below is pursued:

The amplitudes of the reflections in the signal curve are a measure for the impedance change in the container 12 and thus also a measure for the change in the relative electrical dielectricity constant at a respective border layer 18, 20. The level of a pulse in the signal curve depends on this change in the dielectricity constant and on the signal energy already lost above reflections which have taken place. The shape of the respective reflected pulse is maintained; the pulses only differ in their levels.

The signal curve S can thus be considered as a linear superposition of the pulse shape s(t) with only different scalings by the levels $a_n$ and different time positions $t_n$ of the n pulses being considered:

$$S = \sum_{i=1}^{n} s(t - t_n) a_n.$$

The constant pulse shape s(t) also means that an integral over the signal curve S is composed of integrals scaled over the levels over this pulse shape s(t).

$$\int a_n s(\tau - t_n) d\tau = a_n \int s(\tau - t_n) d\tau$$

Both the signal curve S itself and its amplitudes, thus also for the integral I(t) over the signal curve, are each functions of the dielectricity constant $\in_r$. In this respect $$I(t) = \int_0^t S(\tau) d\tau = \int_0^t \sum_{i=1}^{N} s(\tau - t_n) a_n d\tau$$

further applies.

As FIG. 3 illustrates, the signal propagation speeds c of the electrical wave differ in the different layers, and indeed in dependence on the dielectricity constant $\in_r$. Whereas in air with in practice $\in_r=1$ the vacuum light speed $c_0$ can be assumed, the speed is delayed within the media 14, 16 by $$\frac{1}{\sqrt{\in_r}}.$$

Accordingly, the equivalent path at dielectricity constants $\in_{r1}, \in_{r2}$ of the first medium 14 or of the second medium 16 at a time step ΔT of the signal time of flight, for example a sampling period of the A/D converter 38, is for air: $c_0 \Delta T$
for the first medium 14:

$$\frac{c_0 \Delta T}{\sqrt{\varepsilon_{r1}}}$$

and
for the second medium 16:

$$\frac{c_0 \Delta T}{\sqrt{\varepsilon_{r2}}}.$$

This should preferably be taken into account by a corresponding time adaptation in the evaluation because otherwise the spacings of the boundary surfaces 18, 20 are systematically overestimated. The dielectricity constants are, however, either not known in advance due to a lack of knowledge of the media 14, 16 or, for example in the case of an inhomogeneous foam with a density varying over the level, are even not known in principle in advance.

Provided that, as in a situation in accordance with FIG. 3, the amplitude $A_1$ of the measured pulse 40 can be determined from the first medium 14, the associated dielectricity constant $\in_{r1}$ can be calculated. In a procedure which the DE 10 2012 101 725 quoted in the introduction explains in more detail which is additionally referenced here, a reference amplitude $A_{end}$ of the artifact pulse from the probe end is first determined. Effects of the geometry of the container 12 and of other signal changes can thereby be taken into account. The reference amplitude $A_{end}$ is calculated, simulated or determined by a calibration measurement, also repeated, in the empty state of the container 12, for example.

$$\varepsilon_{r1} = \frac{A_{end} - A_1}{A_{end} + A_1}$$

then applies.

As all pulses, the artifact pulse also satisfies the relationship $$\int A_{end} s_{end}(t) dt = A_{end} \int s_{end}(t) dt$$

so that in particular the amplitude $A_{end}$ of the artifact pulse is proportional to its area.

A plurality of superposed pulses results from a continuous transition of the wave impedance within the second medium 16 from the wave impedance of the air to the wave impedance of the first medium 14. An individual pulse evaluation as in FIG. 3 is then no longer possible, just as little as $\in_{r1}$ can be calculated from $A_1$ and $A_{end}$.

An evaluation of integrals over the signal curve S is, however, possible and of corresponding integrals over the artifact pulse or further integrals which are determined as parameters in a controlled situation, for example with an empty container or with a container without a second medium 16. The signal curve S is therefore no longer divided into discrete pulses at all, but a hypothetical or actual reflection due to a change in the dielectricity constant is rather assumed at each point. Then the position in the signal curve S is localized at which so much signal energy was reflected as in a comparable situation without a second medium 16 and this position is recognized as the first boundary surface 18. To correctly determine its spacing, the delay by the second medium 16 should preferably be taken into account on the conversion of the signal time of flight into a path.

This procedure requires a simplifying assumption, with it, however, being shown in practical measurements that good measured results are obtained despite this simplification. It is namely assumed that the transmitted signal energy which arrives at the first boundary surface 18 is independent of the course of the impedance changes above the first boundary surface 18. The same energy loss of the signal through preceding reflections is therefore assumed irrespective of the manner in which the dielectricity constant varies from 1 in the upper air layer to $\in_{r1}$ at the first boundary layer 18, that is whether, for example, it is in one jump directly at the first boundary surface 18, increasing monotonously between the second boundary surface 20 and the first boundary surface 18 as with a foam which becomes denser and denser or with any other desired behavior. The measurements, which are robust with respect to this approximation, allow the assumption that particularly pathological curves practically do not occur.

These general considerations can be illustrated by way of example in a specific algorithm. The invention should, however, not thereby be restricted to this algorithm, but rather also comprises other implementations of the procedure just described.

In preparation, in a first step analogous to DE 10 2012 101 725, the artifact pulse from the probe end is measured with an empty container 12 to detect the environmental influences of the specific installation situation of the TDR sensor 10. However, in accordance with the integral method presented here, it is not its amplitude which is determined, but rather the integral $I_{end}$ over the signal curve S is formed in the region of the artifact pulse, with here, however, as presented above, a proportionality relationship being present.

In a second preparatory step, the container 12 is only filled with the first medium 14 and care is taken that no foam is also formed as a second medium 16 or that it has dissolved. It is ensured in this controlled environment that a clearly recognizable measured pulse 40 or medium pule is generated at the first boundary surface 18. The integral $I_{Medium}$ is then formed over the measured pulse 40. This measurement primarily takes place to compensate the different influences of the dielectricity constant $\in_{r1}$ of the first medium 14 and could therefore alternatively be replaced by a default or by an independent measurement of the dielectricity constant $\in_{r1}$, for example by a subsequent calculation of $I_{Medium}$ using the known pulse shape s(t).

During the actual measurement, the integral over the signal curve S is then integrated from an initial value $t_0$, for example corresponding to the probe start or to a selected highest possible filling level, up to a respective considered time t. An integral over the signal curve $$I_S(t) = \int_0^t S(\tau)d\tau$$

is therefore formed which is a function of the respectively considered time t.

The position of the boundary surface 18 is then found by a comparison of the integral over the signal curve $I_S$ with the reference $I_{Medium}$. For this purpose, it is determined, for example, what $I_S(t)=K \cdot I_{Medium}$ applies to, with K being a scaling factor. If K is selected in the vicinity of one, then t corresponds to the position of the first boundary surface 18. On a selection of K only slightly above zero, in contrast, the position of the second boundary surface 20 is found. A combination additionally makes it possible to measure the layer thickness of the second medium 17.

The found t now, however, corresponds to a signal time of flight which is composed of amounts of signal paths in air, in the second medium 16 and possibly also of portions in the first medium 14. Filling levels are therefore systematically underestimated if the equivalent path is not corrected by time adaptation using the different wave propagation speeds. Such a time adaptation is possible using the integral over the signal curve $I_S$ and becomes even more accurate if the environmental influences are additionally taken into account, for example by $I_{end}$. The time adaptation can specifically then take place analogously to the above-cited calculation rule $$\varepsilon_{r1} = \frac{A_{end} - A_1}{A_{end} + A_1}$$

using the term $$\frac{I_{end} - I_S}{I_{end} + I_S}.$$

In the practical implementation, the signal curve S is typically present as a time series S[i] of discrete samples. In a further preferred embodiment, it is therefore expedient to perform the evaluations iteratively and to calculate the integral over the signal curve $I_S$ and the time adaptation step-wise. For this purpose, all the values are initially initialized at zero and then adapted iteratively for the following sampling procedures stepwise starting from the start of the measured range at $t_0 \cdot I_S$ reaching a threshold $K \cdot I_{Medium}$ derived from the reference value $I_{Medium}$ serves as an abort criterion.

An exemplary iterative evaluation can then be presented as follows in pseudocode:

```
I_S = 0; i = 0; t = 0
WHILE (I_S < K · I_Medium)
    I_S = I_S + S[i];

t = t + (I_end + I_S)/(I_end - I_S);

i = i + 1;
END
```

It is to be considered in this respect that $I_{end}$ is negative, like the artifact pulse itself. In addition, the correction value for the time adaptation $$\frac{I_{end} + I_S}{I_{end} - I_S}$$

should preferably be examined as to whether it lies in the interval [0, 1 . . . 1] since it would otherwise not be plausible.

The result is the signal time of flight t which has already been corrected by the different signal propagation speeds in the media 14, 16 and whose unit is sampling steps. The sampling rate is known so that it can be directly converted into an absolute time of flight and also into a spacing by means of the vacuum speed $c_0$. The constant is advantageously calculated in advance which carries out this conversion from signal time of flight in sampling steps into a spacing by simple multiplication.

A special situation can in particular result when the second medium 16 is foam. It is namely conceivable that the dielectricity constant does not increase monotonously with an increasing spacing, but rather that impedance jumps also result with opposite signs. This takes place, for example, when a denser foam layer lies on a thinner foam layer or when air bubbles are formed. The result is reflected pulses with opposite signs or negative values in the signal curve S. This has the result that $I_S$ temporarily falls despite an increasing penetration depth of the signal. The spacing of the boundary surface 18 is thus overestimated, in the worst case the threshold $K \cdot I_{Medium}$ is even never reached. The energy which is reflected back until the wave is in the medium 14, is, however, approximately independent of the individual stages of the impedance changes thereabove. The abort condition should therefore preferably be based instead of on signal curve S provided with a sign, on its absolute amount or square. For this purpose, a second integral $I_{Stop}$ is introduced which sums over the absolute amount or in a very analog manner the square or a similar suitable moment.

A further preferred embodiment of the evaluation then results which can be summarized in this pseudocode:

```
I_S = 0; I_Stop = 0; i = 0; t = 0
WHILE (I_Stop < K · I_Medium)
    I_S = I_S + S[i];
    I_Stop = I_Stop + |S[i]|;
    t = t + (I_end + I_S)/(I_end - I_S);
    i = i + 1;
END
```

The integration in the pseudocode respectively takes place in the simplest manner by summing the values of the signal curve S. The invention equally comprises other processes of numerical integration. In a similar manner, the specific formula for the time adaptation can be replaced. In this respect, the integral over the signal curve is admittedly likewise used since it takes account of the signal energy lost by reflection above the time considered in the respective iteration step. The environmental influences can, however, also be taken into account differently from over the artefact pulse by $I_{End}$, in particular in that a different pulse such as the transition pulse 44 or other information from the signal curve S is used.

In preparation, the signal curve S can still be corrected in various manners. A rescaling can thus take place for the compensation of drifts, in particular a temperature compensation, for example in that the transition pulse 44 at the probe start or the transmitted pulse is compared with a reference to estimate the drift influences.

A further compensation option is to correct the signal curve by an amplitude characteristic. For the signal curve S is exaggerated for small times in accordance with the upper region of the container because multiple reflections occur between the probe start and the boundary surface 18, 20. This influence can be determined in advance and can be expressed in position-dependent or time-dependent exaggeration factors which are then compensated by the amplitude characteristic. This is also explained in more detail in DE 10 2012 101 725 which is additionally referred to.

Finally, the invention should be illustrated in accordance with FIGS. 4 to 7 for the example of different foam layers as the medium 16.

FIG. 4 shows in the upper part the signal curve S with characterization of the time recognized as the border transition 18 to the first medium 14 in an example of a container 12 having a liquid as a first medium 14 and a thick foam layer arranged thereabove as a second medium 16.

It must first be noted in this respect that the higher curve series was corrected in a first step as just described by an amplitude characteristic to compensate an initial signal exaggeration due to multiple reflections. The signal curve S actually used as the basis for the evaluation is therefore the lower curve in which the area measured as the integral over the signal curve $I_S$ is also highlighted by gray. The first boundary surface 18 is recognized at the perpendicular line approximately at the 70th sampling.

In the middle part, FIG. 4 shows the integral over the signal curve $I_S$, integrated up to the respective sampling point which integrates the gray area beneath the signal curve S of the upper part of FIG. 4 step-wise. A threshold shown as a thin gray line is exceeded approximately at the 70th sampling in accordance with the position of the perpendicular line in the upper part of FIG. 4 by the integral over the signal curve $I_S$, whereat the evaluation recognizes the first boundary surface 18. In a plurality of embodiments, this threshold lies at $K \cdot I_{Medium}$. The dashed line corresponds to the total energy of the transmitted pulse and can be exceeded at the probe end at the earliest.

FIG. 4 illustrates the time adaptation in the lower part. The dashed line corresponds to the undisturbed wave propagation in air at maximum speed $c_0$. The adapted time required for the equivalent path propagation increases more slowly due to the correction factor $$\frac{I_{end} + I_S}{I_{end} - I_S},$$

as the solid line shows. The adapted signal time of flight up to the first boundary surface 18 can be read off from the sampling value which corresponds to the abort criterion which lies approximately at the 70th sampling value in FIG. 4 and can be converted into a filling level.

FIG. 5 show in a very analog manner a further example of a container 12 with a liquid as a first medium 14 and a thinner foam layer arranged thereabove as a second medium 16 whose density increases continuously.

In the example of FIG. 6, the foam layer again has a different consistency and thickness.

FIG. 7 shows a case in which only foam is located in the container 12 as the only medium 14, 16. The threshold is here only exceeded very far to the rear, depending on the setting of K only for values which would correspond to a negative filling level and therefore allow the conclusion that no medium 14 is present in the container 12. A conventional algorithm would have recognized the pronounced first pulse or one of the two subsidiary pulses and would have output the corresponding filling level, which would be much too high, despite the container being empty per se except for the foam.

If the filling level of the second medium 16 is to be determined, this can be done in accordance with the above by selection of a K close to zero. Alternatively, the second boundary surface 20 can, however, also be recognized in that the integral over the signal curve $I_S$ systematically differs from zero. This can be recognized in each case in the middle part of FIGS. 4 to 7. At the same time, the adapted time in the lower part of FIGS. 4 to 7 also systematically differs for the first time from the original straight line of the uncompensated time. Systematic difference in each case here means that a slight difference solely due to noise influences should not yet be evaluated. This can be distinguished, for example, with the aid of a smoothing filter.

The invention was described for a filling level measurement of a medium 14 with a layer of a second medium 16 located thereabove. A filling level of a medium will naturally, however, also be measured using the same procedure if no further layer is located thereabove. A generalization of the process to non-guided waves, that is to a sensor 10 without a probe 28, such as a radar sensor, is also conceivable in principle.

The invention claimed is:

1. A method of filling level measurement in a container (12) having a first medium (14) and at least one second medium (16) arranged thereabove, the method comprising the steps of:
   transmitting an electromagnetic signal in the container (12), and recording a signal curve (S) of the signal reflected in the container (12);
   determining a signal time of flight (t) up to a border transition (18, 20) to the first medium (14) and/or up to the second medium (16) with reference to the signal curve (S);
   determining a filling level of the first medium (14) and/or a filling level of the second medium (16) from the signal time of flight (t);
   determining the threshold value ($K \cdot I_{medium}$) by a calibration measurement in which only the first medium (14) is located in the container (12) and a threshold value integral $I_{Medium}$) of the signal curve (S) is formed in a region of an echo signal (40) at the border transition (18) to the first medium (14); and
   recognizing the border transition (18, 20) by a comparison of the integral over the signal curve ($I_S$) with a threshold value ($K \cdot I_{Medium}$), the integral starting from a reference position ($t_0$).

2. The method in accordance with claim 1, wherein the at least one second medium (16) is a foam layer.

3. The method in accordance with claim 1, wherein the electromagnetic signal is transmitted along a probe (28) arranged in the container (12).

4. The method in accordance with claim 1, wherein the reference position ($t_0$) is a probe start position.

5. The method in accordance with claim 1, comprising the further step of summing the signal time of flight (t) from signal time of flight intervals which take account of a delay in propagation of the electromagnetic signal in the container at a probe position belonging to a respective signal time of flight interval by a correction with the integral over the signal curve ($I_S$) integrated up to this respective probe position.

6. The method in accordance with claim 5, comprising the further step of additionally entering an environmental constant dependent on specific wave propagation in the container (12) into the correction.

7. The method in accordance with claim 6, comprising the further step of determining the environmental constant in a calibration measurement with an empty container (12), in which measurement an integral ($I_{end}$) of the signal curve (S) is formed over a region of an artifact pulse arising at a probe end.

8. The method in accordance with claim 1, comprising the further step of integrating the signal curve (S) for a second time for the comparison, but, instead of the signal curve (S) itself, its absolute amount (|S|) or the signal curve ($S^2$) squared point-wise is used as the basis for the second integration ($I_{Stop}$).

9. The method in accordance with claim 1, comprising the further step of recognizing the border transition (18, 20) in an iterative process which integrates the signal curve (S) in steps predefined by the sampling rate of the signal curve (S) from the reference position ($t_0$) onward up to an abort criterion, namely whether the signal curve ($I_S$) integrated up to the respective step (i) or a corresponding integral ($I_{Stop}$) of the absolute amount (|S|) of the signal curve (S) or of the signal curve ($S^2$) squared point-wise exceeds the threshold value ($K \cdot I_{Medium}$).

10. The method in accordance with claim 9, comprising the further steps of summing the signal time of flight (t) from signal time of flight intervals which take account of a delay in the signal propagation at a probe position belonging to a respective signal time of flight interval by a correction with the integral over the signal curve ($I_S$) integrated up to this respective probe position; and
   of initially setting the signal time of flight (t) to zero and of increasing every step (i) by an increment $$\left( \frac{I_{end} + I_S}{I_{end} - I_S} \right)$$

which is calculated as a quotient whose numerator is formed from the sum ($I_{end}+I_S$) from the environmental constant ($I_{end}$) and the integral over the signal curve ($I_S$) and its denominator is formed from the difference ($I_{end}-I_S$) from the environmental constant ($I_{end}$) and the integral over the signal curve ($I_S$).

11. The method in accordance with claim 10, comprising the further step of additionally entering an environmental constant dependent on a specific wave propagation in the container (12) into the correction.

12. The method in accordance with claim 1, comprising the further step(s) of setting the threshold value ($K \cdot I_{Medium}$) to 90% to 110% of the threshold value integral ($I_{Medium}$) to recognize the border transition (18) to the first medium (14) and/or of setting the threshold value ($K \cdot I_{Medium}$) to 5% to 30% of the threshold value integral ($I_{Medium}$) to recognize the border transition (20) to the second medium (16).

13. The method in accordance with claim 1, comprising the further step of recognizing the border transition (20) to the second medium (16) in that the integral over the signal curve ($I_S$) differs systematically from zero from the border transition (20) onward.

14. The method in accordance with claim 1, comprising the further step of scaling at least one of the members selected from the group comprising the signal curve (S), the integral over the signal curve ($I_S$) and the threshold value ($K \cdot I_{Medium}$) by a drift correction value.

15. The method in accordance with claim 1, comprising the further step of resealing the signal curve (S) by an amplitude characteristic dependent on the filling level of the first medium and/or second medium.

16. A sensor (10) having a transmitter (32) and a receiver (34) for transmitting and receiving an electromagnetic signal, as well as having a control (30) which is configured to determine the filling level of a medium (14) and/or of a second medium (16) in a container (12) with reference to the time of flight of the signal,
   wherein the control (30) is configured to determine the filling level using a method comprising the steps of:
   transmitting an electromagnetic signal in the container (12), and
   recording a signal curve (S) of the electromagnetic signal reflected in the container (12);
   determining a signal time of flight (t) up to a border transition (18, 20) to the first medium (14) and/or up to the second medium (16) with reference to the signal curve (S);

determining a filling level of the first medium (14) and/or a filling level of the second medium (16) from the signal time of flight (t);

determining the threshold value ($K \cdot I_{Medium}$) by a calibration measurement in which only the first medium (14) is located in the container (12) and a threshold value integral ($I_{Medium}$) of the signal curve (S) is formed in a region of an echo signal (40) at the border transition (18) to the first medium (14); and recognizing the border transition (18, 20) by a comparison of an integral over the signal curve ($I_S$) with a threshold value ($K \cdot I_{Medium}$), the integral starting from a reference position ($t_0$).

17. The sensor in accordance with claim 16, wherein the sensor is a TDR filling level sensor.

18. The sensor in accordance with claim 16, wherein the electromagnetic signal is a microwave signal.

\* \* \* \* \*

UNITED STATES PATENT AND TRADEMARK OFFICE
CERTIFICATE OF CORRECTION

PATENT NO.         : 9,316,480 B2                          Page 1 of 1
APPLICATION NO.    : 14/151407
DATED              : April 19, 2016
INVENTOR(S)        : Thomas Weber and Stefan Schweiger It is certified that error appears in the above-identified patent and that said Letters Patent is hereby corrected as shown below:

In the claims,

In claim 1, column 15, line 27, please delete "$I_{Medium}$)" and insert therefor -- ($I_{Medium}$) --

Signed and Sealed this
Fifth Day of July, 2016

Michelle K. Lee
*Director of the United States Patent and Trademark Office*